US012594855B2

(12) United States Patent
Iwamoto et al.

(10) Patent No.: US 12,594,855 B2
(45) Date of Patent: Apr. 7, 2026

(54) PREDICTION APPARATUS, PREDICTION METHOD, AND PROGRAM

(71) Applicant: NTT, Inc., Tokyo (JP)

(72) Inventors: Miho Iwamoto, Tokyo (JP); Masaki Kozai, Tokyo (JP); Hiroya Minami, Tokyo (JP); Toru Tanaka, Tokyo (JP)

(73) Assignee: NTT, Inc., Tokyo (JP)

( * ) Notice: Subject to any disclaimer, the term of this patent is extended or adjusted under 35 U.S.C. 154(b) by 24 days.

(21) Appl. No.: 18/866,753

(22) PCT Filed: Jun. 6, 2022

(86) PCT No.: PCT/JP2022/022861
§ 371 (c)(1),
(2) Date: Nov. 18, 2024

(87) PCT Pub. No.: WO2023/238210
PCT Pub. Date: Dec. 14, 2023

(65) Prior Publication Data
US 2025/0332956 A1 Oct. 30, 2025

(51) Int. Cl.
*B60L 58/12* (2019.01)
*G01R 31/367* (2019.01)

(52) U.S. Cl.
CPC ............ *B60L 58/12* (2019.02); *G01R 31/367* (2019.01)

(58) Field of Classification Search
CPC ........ B60L 58/12; B60L 2260/50; B60L 3/12; B60L 2260/52; B60L 2260/54;
(Continued)

(56) References Cited

U.S. PATENT DOCUMENTS

2019/0351783 A1* 11/2019 Goei ...................... G08G 1/202
2023/0141525 A1* 5/2023 Eitzer ................ H01M 10/482
320/109
(Continued)

FOREIGN PATENT DOCUMENTS

JP 2014079069 A * 5/2014
JP 2020096416 A * 6/2020

OTHER PUBLICATIONS

Yasuhiro Shibata et al., "System to Support EV Drivers Travelling on Expressways and its Technology Using AI to Predict Power Consumption of EVs", Toshiba Review vol. 72 No.3 ( 2017), pp. 11-14, https://www.global.toshiba/content/dam/toshiba/migration/corp/techReviewAssets/tech/review/2019/05/74_05pdf/f02.pdf.

*Primary Examiner* — Adnan Aziz

(74) *Attorney, Agent, or Firm* — IPUSA, PLLC

(57) ABSTRACT

A prediction apparatus for predicting a remaining capacity value of a battery of a vehicle includes a processor; and a memory storing instructions for executing a process including acquiring usage record data including information regarding a travel distance of the vehicle and information indicating a charge amount of the battery or information indicating a charging time of the battery as a past use record of the vehicle, and acquiring usage schedule data including information regarding a travel distance of the vehicle as a future usage schedule of the vehicle; determining the battery being charged when a predetermined travel distance is higher than a threshold; calculating a correction value as a predetermined charge amount; predicting a remaining capacity value of the battery at return; using the correction value to execute correction on the predicted remaining capacity value; and outputting a remaining capacity value of the battery after executing the correction.

6 Claims, 10 Drawing Sheets

(58) Field of Classification Search
CPC ...... G01R 31/367; G06Q 50/10; Y02T 10/70;
Y02T 90/167; Y02T 90/14; Y02E 60/00;
Y02E 60/10; H02J 3/00; H02J 3/32; H02J
7/00
See application file for complete search history.

(56) References Cited

U.S. PATENT DOCUMENTS

| | | | | |
|---|---|---|---|---|
| 2023/0168696 A1* | 6/2023 | Lane | ........................ | B60L 58/13 |
| | | | | 701/25 |
| 2023/0256855 A1* | 8/2023 | Sartipizadeh | ........... | B60L 53/64 |
| | | | | 320/109 |
| 2023/0286415 A1* | 9/2023 | Ishii | ...................... | B60L 3/0046 |
| 2023/0311698 A1* | 10/2023 | Saita | ...................... | B60L 58/12 |
| | | | | 320/109 |
| 2023/0339360 A1* | 10/2023 | Kobashi | .................. | B60L 58/12 |
| 2023/0347776 A1* | 11/2023 | McLachlan | ............ | B60L 58/13 |
| 2024/0051429 A1* | 2/2024 | Jo | ........................... | B60L 53/68 |
| 2024/0361137 A1* | 10/2024 | Aviv | ...................... | B60L 58/12 |
| 2025/0033516 A1* | 1/2025 | Sada | .................... | H01M 10/44 |

* cited by examiner

Fig. 1

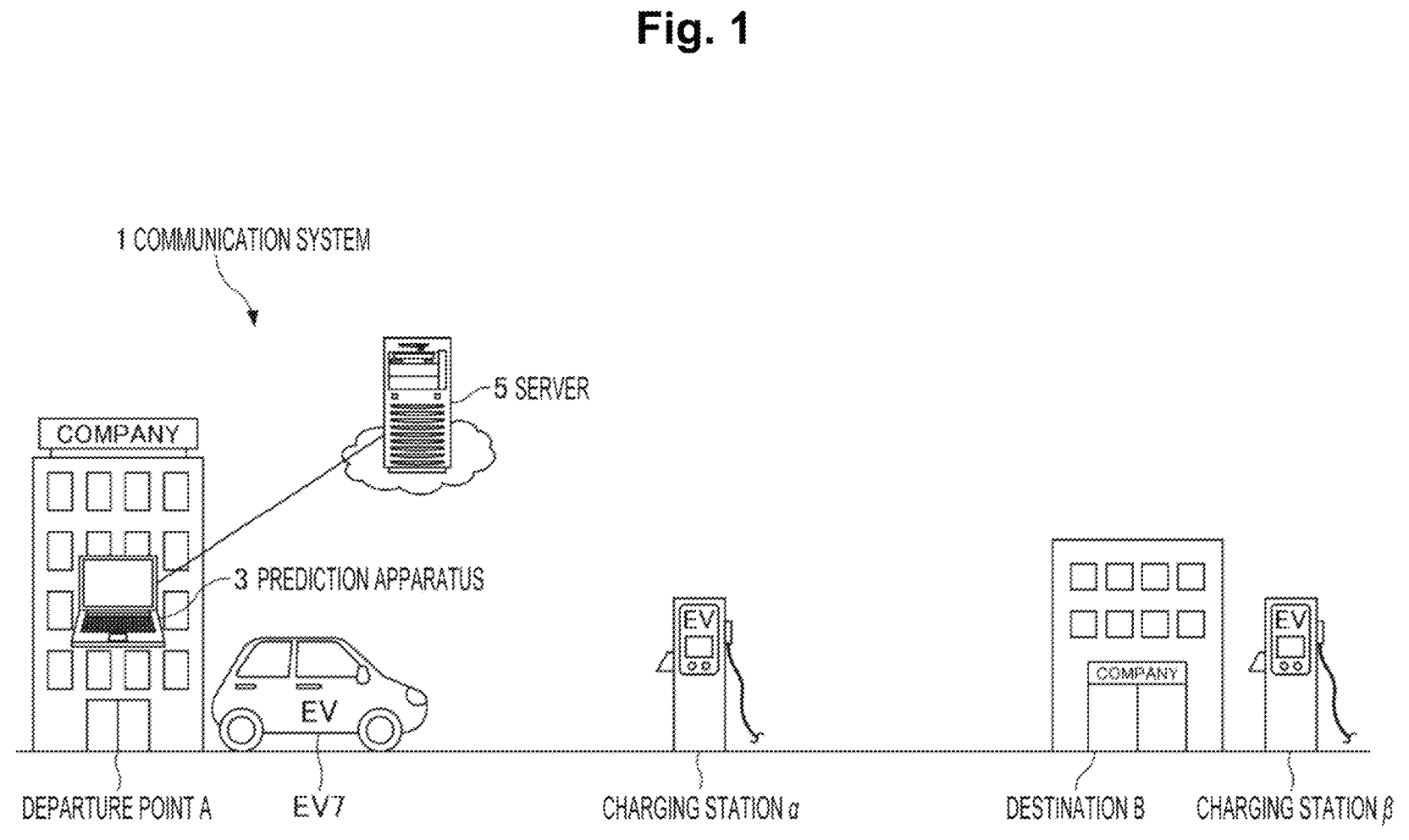

1 COMMUNICATION SYSTEM

5 SERVER

3 PREDICTION APPARATUS

EV7

DEPARTURE POINT A

COMPANY

EV

CHARGING STATION α

EV

DESTINATION B

CHARGING STATION β

COMPANY

Figure 4:
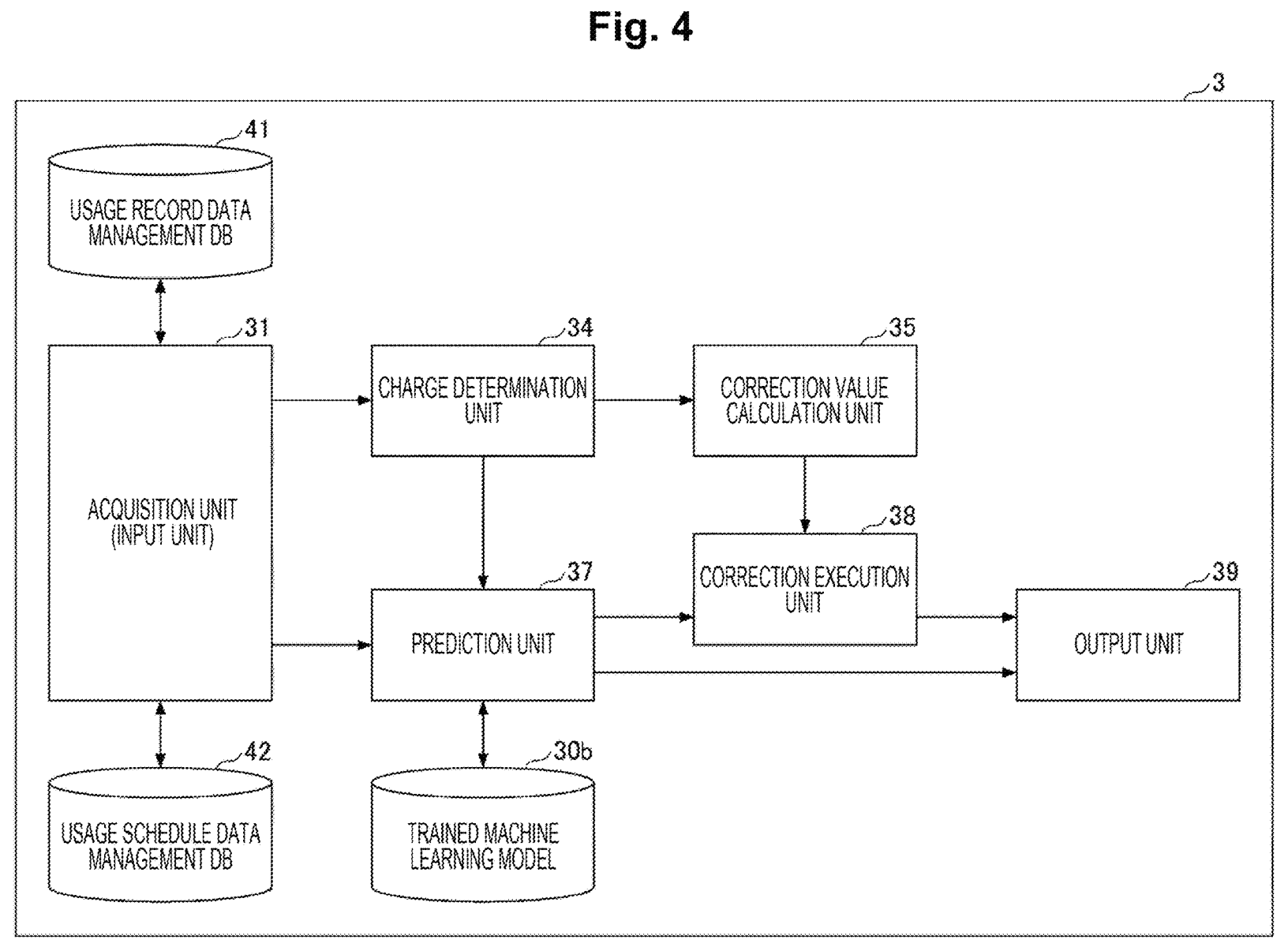

41 USAGE RECORD DATA MANAGEMENT DB

31 ACQUISITION UNIT (INPUT UNIT)

42 USAGE SCHEDULE DATA MANAGEMENT DB

34 CHARGE DETERMINATION UNIT

37 PREDICTION UNIT

30b TRAINED MACHINE LEARNING MODEL

35 CORRECTION VALUE CALCULATION UNIT

38 CORRECTION EXECUTION UNIT

39 OUTPUT UNIT

Fig. 5

| USE DATE | USER ID | DESTINATION | ONE-WAY DISTANCE | WORK CONTENT | USAGE TIME OF EV | TIME OF STAY AT DESTINATION | REMAINING BATTERY CAPACITY VALUE AT TIME OF DEPARTURE | REMAINING BATTERY CAPACITY VALUE AT TIME OF RETURN | PRESENCE OR ABSENCE OF CHARGING | CHARGE AMOUNT (CHARGING TIME) | CHARGING PLACE |
|---|---|---|---|---|---|---|---|---|---|---|---|
| 2022/2/20 | a | B | 60km | INSPECTION WORK | 8 | 5 | 100 | 50 | PRESENCE | 70(0.7h) | B($\beta$) |
| 2022/2/23 | b | C | 80km | MAINTENANCE | 7 | 3 | 95 | 65 | PRESENCE | 60(0.6h) | $\alpha$ |
| 2022/3/23 | a | B | 60km | INSPECTION WORK | 8 | 5 | 95 | 60 | PRESENCE | 50(0.5h) | B($\beta$) |
| 2022/3/24 | c | D | 30km | REGULAR MEETING | 5 | 2 | 80 | 80 | ABSENCE | 0 | — |
| 2022/4/10 | d | E | 150km | DAY BUSINESS TRIP | 10 | 9 | 100 | 20 | ABSENCE | 0 | — |
| 2022/4/22 | c | D | 30km | REGULAR MEETING | 5 | 2 | 80 | 85 | ABSENCE | 0 | — |

Fig. 6

| SCHEDULED USE DATE | USER ID | DESTINATION | ONE-WAY DISTANCE | WORK CONTENT | USAGE TIME OF EV | TIME OF STAY AT DESTINATION |
|---|---|---|---|---|---|---|
| 2022/5/1 | a | B | 60km | INSPECTION WORK | 10 | 7 |
| 2022/5/2 | b | E | 80km | MAINTENANCE | 7 | 3 |
| 2022/5/3 | c | B | 60km | INSPECTION WORK | 8 | 5 |

START

S11

ACQUISITION UNIT 31 ACQUIRES LEARNING DATA

S12

MACHINE LEARNING UNIT 33 CAUSES MACHINE LEARNING MODEL 30g
TO PERFORM MACHINE LEARNING BASED ON LEARNING DATA

END

START

S21

ACQUISITION UNIT 31 ACQUIRES USAGE RECORD DATA AND USAGE SCHEDULE DATA

S22

CHARGE DETERMINATION UNIT 34 DETERMINES WHETHER CHARGING IS PERFORMED BASED ON USAGE RECORD DATA

S23

IS CHARGING PERFORMED?

YES

NO

S24

CORRECTION VALUE CALCULATION UNIT 35 CALCULATES CORRECTION VALUE BASED ON USAGE RECORD DATA

B

A

PREDICTION APPARATUS, PREDICTION METHOD, AND PROGRAM

TECHNICAL FIELD

The present disclosure relates to a technology for predicting a remaining capacity value of a battery of a vehicle such as an electric vehicle (EV).

BACKGROUND ART

In recent years, there has been a movement to utilize batteries of an EV for supply and demand control for matching supply and demand of electricity. A user who utilizes the battery of an EV for supply and demand control needs to ascertain the remaining capacity (discharge capacity) of the battery or the free capacity (charge capacity) of the battery several days to several hours before the time when the utilization is scheduled to be started.

On the other hand, conventionally, a technology for predicting a remaining capacity of a battery of an EV based on a past use history of the battery has been disclosed (Non Patent Literature 1). In the technology disclosed in Non Patent Literature 1, a model is constructed based on charging information of the EV and traffic information measured on a highway, a distance from an initial position (departure point) to a current position and an average speed are calculated based on the model using real-time position information acquired during traveling of the EV, and a power consumption therebetween is calculated to estimate a current remaining battery capacity.

CITATION LIST

Non Patent Literature

Non Patent Literature 1: EV Navigation System for Traffic Control Systems to Avoid Battery Power Shortages on Expressways (https://www.global.toshiba/content/dam/toshiba/migration/corp/techReviewAssets/tech/review/2019/05/74_05pdf/f02.pdf.)

SUMMARY OF INVENTION

Technical Problem

However, according to the technology disclosed in Non Patent Literature 1, in order to ascertain the remaining capacity of the battery, it is necessary to install a communication device on the EV side or install a server that acquires information on the EV side in real time, and high costs are incurred in constructing such a system. Moreover, since the server needs to acquire a large number of pieces of information such as charging information, traffic information, a vehicle type, and a current position of the EV in real time from the EV side, the processing becomes complicated and is difficult to realize.

The present invention has been made in view of the above points, and an object of the present invention is to predict a remaining battery capacity of a vehicle such as an EV more easily than in the prior art.

Solution to Problem

In order to solve the above problem, an invention according to claim 1 is a prediction apparatus for predicting a remaining capacity value of a battery of a vehicle, the prediction apparatus including: an acquisition unit configured to acquire usage record data including information regarding a travel distance of the vehicle and information indicating a charge amount of the battery or information indicating a charging time of the battery as a past use record of the vehicle, and acquire usage schedule data including information regarding a travel distance of the vehicle as a future usage schedule of the vehicle; a charge determination unit configured to determine that the battery has been charged when a predetermined travel distance based on the information regarding the travel distance included in the usage record data is higher than a threshold; a correction value calculation unit configured to calculate a correction value as a predetermined charge amount based on information indicating the charge amount or information indicating the charging time included in the usage record data in a case where the charge determination unit determines that charging has been performed; a prediction unit configured to predict a remaining capacity value of the battery at the time of return with respect to the usage schedule data acquired by the acquisition unit using a trained machine learning model that outputs a remaining capacity value of the battery at the time of return with the usage schedule data as an input; a correction execution unit configured to use the correction value calculated by the correction value calculation unit to execute correction on the remaining capacity value of the battery at the time of return predicted by the prediction unit; and an output unit configured to output a remaining capacity value of the battery after correction by the correction execution unit.

Advantageous Effects of Invention

As described above, according to the present invention, it is possible to predict the remaining battery capacity of the vehicle more easily than in the prior art.

BRIEF DESCRIPTION OF DRAWINGS

FIG. 1 is a schematic diagram illustrating a usage status of a prediction apparatus according to an embodiment.

FIG. 2 is an electrical hardware configuration diagram of a prediction apparatus and a server.

FIG. 4 is a functional configuration diagram of a prediction apparatus in a prediction (estimation) phase.

FIG. 5 is a conceptual diagram illustrating a usage record data management table constituting a usage record data management DB.

FIG. 6 is a conceptual diagram illustrating a usage schedule data management table constituting a usage schedule data management DB.

DESCRIPTION OF EMBODIMENTS

Figure 3:
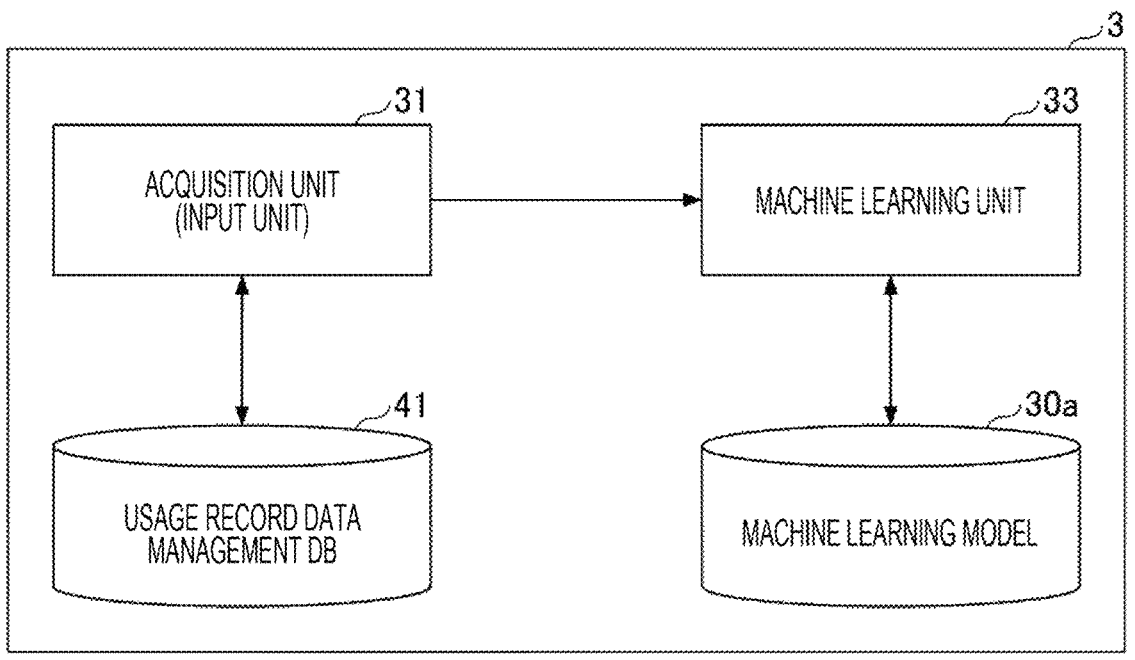
FIG. 3 is a functional configuration diagram of a prediction apparatus in a learning phase.

Hereinafter, an embodiment of the present invention will be described with reference to the drawings.

[System Configuration of Embodiment]

First, an overall outline of a communication system of the present embodiment will be described with reference to FIG.

3

1. FIG. 1 is a schematic diagram illustrating a usage state of a prediction apparatus according to an embodiment.

As illustrated in FIG. 1, a communication system 1 of the present embodiment is constructed by a prediction apparatus 3 and a server 5.

The prediction apparatus 3 includes one or a plurality of computers. When the prediction apparatus 3 includes a plurality of computers, the prediction apparatus 3 may be referred to as a "prediction apparatus" or a "prediction system". The prediction apparatus 3 is a device that predicts a remaining capacity (discharge capacity) of a battery of a vehicle such as the EV 7. Note that the prediction apparatus 3 may predict the free capacity (charge capacity) of the battery instead of the remaining capacity of the battery. In this case, the prediction apparatus 3 can finally obtain the remaining capacity of the battery by subtracting the predicted free capacity from the battery capacity.

The server 5 includes one or a plurality of computers. The server 5 stores map information, various parameters, and the like.

The prediction apparatus 3 and the server 5 can communicate with each other via a communication network such as the Internet. A connection form of the communication network may be either wireless or wired. In addition, in FIG. 1, the prediction apparatus 3 is placed in a company at a departure point A. For example, an employee of the company at the departure point A rides with the EV 7, departs from the departure point A, travels to the destination B, finishes work such as a meeting at the destination B, and rides with the EV 7 again then returning from the destination B to the departure point A. In addition, FIG. 1 illustrates a case where there is a charging station α between a departure point A and a destination B, and there is a charging station β at the destination B. In the situation of FIG. 1, a user (employee) can stop at the charging station α in the middle of the round trip and charge the EV 7, and can also charge the EV 7 at the charging station β after arriving at the destination B.

[Hardware Configuration]

<Hardware Configuration of Prediction Apparatus>

Figure 2:
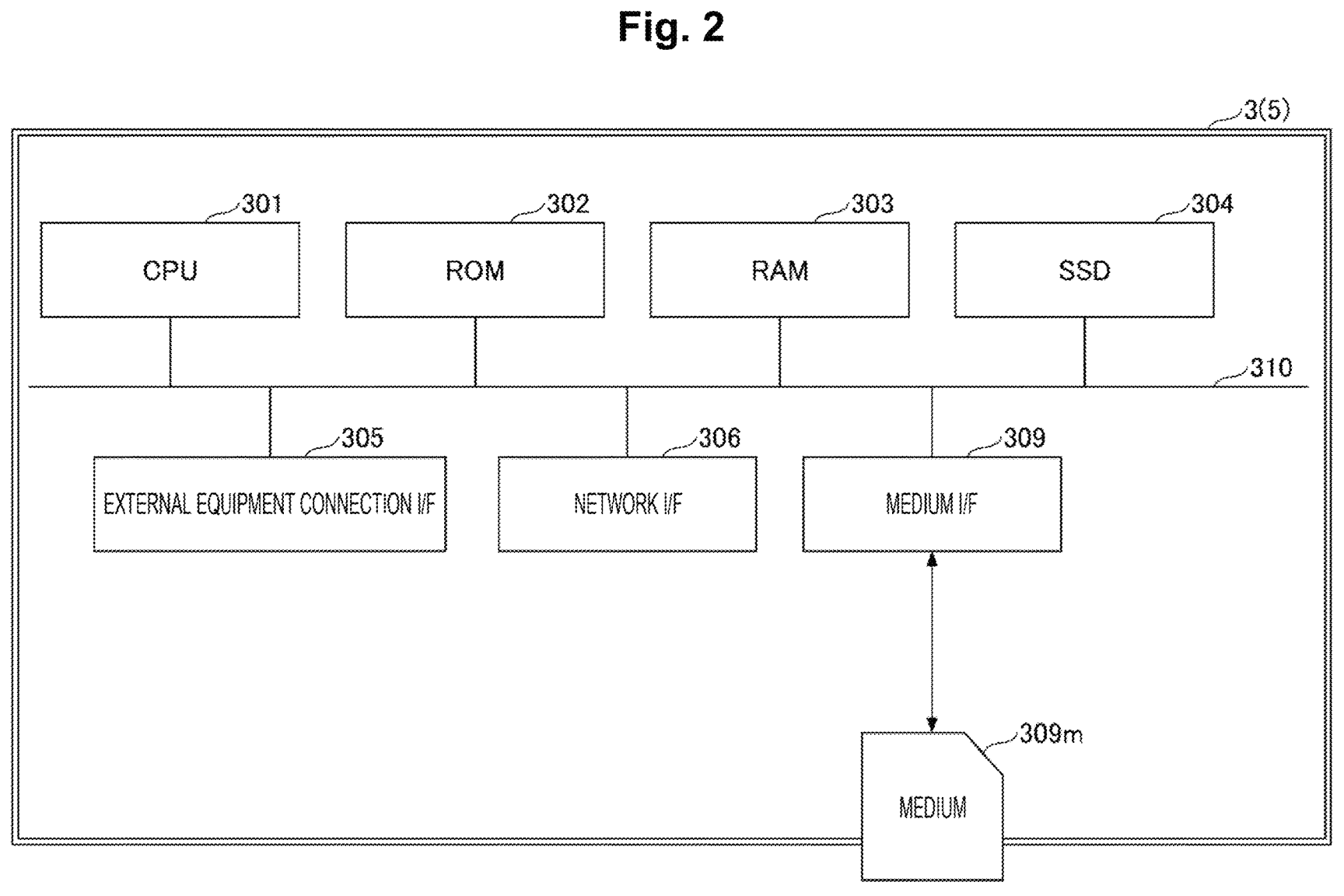

Next, an electrical hardware configuration of the prediction apparatus 3 will be described with reference to FIG. 2. FIG. 2 is an electrical hardware configuration diagram of the prediction apparatus.

As illustrated in FIG. 2, the prediction apparatus 3 includes, as a computer, a central processing unit (CPU) 301, a read only memory (ROM) 302, a random access memory (RAM) 303, a solid state drive (SSD) 304, an external equipment connection interface (I/F) 305, a network I/F 306, a medium I/F 309, and a bus line 310.

Among them, the CPU 301 controls the operation of the entire prediction apparatus 3. The ROM 302 stores a program used for driving the CPU 301, such as an initial program loader (IPL). The RAM 303 is used as a work area of the CPU 301.

The SSD 304 reads or writes various data under the control of the CPU 301. Note that a hard disk drive (HDD) may be used instead of the SSD 304.

The external equipment connection I/F 305 is an interface for connecting various types of external equipment. Examples of the external equipment in this case include a display, a speaker, a keyboard, a mouse, a universal serial bus (USB) memory, and a printer.

The network I/F 306 is an interface for performing data communication via the communication network 100.

The medium I/F 309 controls reading or writing (storing) of data with respect to a recording medium 309m such as a flash memory. Examples of the recording medium 309m also include a digital versatile disc (DVD), a Blu-ray Disc (registered trademark), and the like.

The bus line 310 is an address bus, a data bus, or the like for electrically connecting the respective components such as the CPU 301 illustrated in FIG. 2.

Since the electrical hardware configuration of the server 5 is similar to that of the prediction apparatus 3, the description thereof will be omitted.

[Functional Configuration of Prediction Apparatus]

Next, functional configurations in the learning phase and the estimation (prediction) phase of the prediction apparatus 3 according to the present embodiment will be described.

<Functional Configuration in Learning Phase>

First, each function of the prediction apparatus 3 in the learning phase will be described in detail with reference to FIG. 3. FIG. 3 is a functional configuration diagram of the prediction apparatus in the learning phase.

As illustrated in FIG. 3, the prediction apparatus 3 includes an acquisition unit 31 and a machine learning unit 33. Each of these units is a function realized by a command by the CPU 301 in FIG. 2 based on a program. In addition, a machine learning model 30a and a usage record data management database (DB) 41 are constructed in the RAM 303 or the SSD 304.

(Usage Record Data Management DB)

FIG. 5 is a conceptual diagram illustrating a usage record data management table constituting the usage record data management DB. In the usage record data management table, each usage record data (each record in FIG. 5) corresponding to the number of times of use of the EV 7 is managed. The usage record data is data created based on usage schedule data (see FIG. 6) to be described below, a user (employee or the like) scheduler, and vehicle operation management data.

In the usage record data management table, information of a past use history of the EV 7 is managed. Specifically, in the usage record data management table, respective pieces of information indicating a use date (which may be a use date and time) of the EV 7, a user ID for identifying a user, a destination, a one-way distance (which may be a round trip distance or a travel distance), a work content of the user at the destination, a use time (h) of the EV 7, a stay time (h) of the user at the destination, a remaining battery capacity value (kWh) at the time of departure of the EV 7, a remaining battery capacity value (kWh) of the battery at the time of return of the EV 7, presence or absence of charging on the way from departure to return, a charge amount (kWh) in a case where charging is performed on the way, and a charging place in a case where charging is performed on the way are managed in association with each other.

Note that each piece of information indicating the remaining battery capacity value at the time of departure of the EV 7, the remaining battery capacity value at the time of return of the EV 7, the presence or absence of charging on the way from departure to return, the charge amount in the case of charging on the way, and the charging place in the case of charging on the way may be manually recorded by the user or the like. In addition, the presence or absence of charging on the way from departure to return or the remaining capacity value (kWh) of the battery at the time of return of the charge amount EV7 in the case of charging on the way may be data calculated automatically rather than manually from the difference between an estimated reference consumption estimated from the electricity consumption (catalog value) and the one-way distance, and the actual value of the SoC.

(Machine Learning Model)

The machine learning model 30a is constructed by a known machine learning algorithm such as a neural network, and performs machine learning for each usage record data (each data set). Regression analysis, a support vector machine (SVM), or the like is used.

(Each Functional Configuration)

The acquisition unit 31 acquires each piece of usage record data (each record in FIG. 5) from the usage record data management DB. The acquisition unit 31 also serves as an input unit that inputs each piece of data. The usage record data management DB 41 may be included in the server 5 of FIG. 1. In this case, the acquisition unit 31 acquires each piece of usage record data from the server 5 via the communication network.

The machine learning unit 33 causes the machine learning model 30a to perform machine learning based on the usage record data.

<Functional Configuration in Estimation Phase>

Next, each function of the prediction apparatus 3 in the estimation phase will be described in detail with reference to FIG. 4. FIG. 4 is a functional configuration diagram of the prediction apparatus in the estimation phase.

As illustrated in FIG. 5, the prediction apparatus 3 includes an acquisition unit 31, a charge determination unit 34, a correction value calculation unit 35, a prediction unit 37, a correction execution unit 38, and an output unit 39. Each of these units is a function realized by a command by the CPU 301 in FIG. 2 based on a program. In the RAM 303 or the SSD 304, a trained machine learning model 30b, a usage record data management DB 41, and a usage schedule data management DB 42 are constructed. Note that functional configurations similar to the functional configurations in the learning phase are denoted by the same reference numerals, and description thereof is omitted.

(Trained Machine Learning Model)

The trained machine learning model 30b indicates a state after the machine learning model 30a is machine-trained in the learning phase. The trained machine learning model 30b outputs a remaining capacity value or the like of the battery at the time of return using the usage schedule data as an input.

(Usage Schedule Data Management DB)

FIG. 6 is a conceptual diagram illustrating a usage schedule data management table constituting the usage schedule data management DB. In the usage schedule data management table, each piece of usage schedule data (each record in FIG. 6) corresponding to the scheduled number of usage of the EV 7 is managed. The usage schedule data is data created based on the user (employee or the like) scheduler and the vehicle operation management data.

In the usage schedule data management table, information of a usage schedule of the EV 7 in the future is managed. Specifically, in the usage schedule data management table, each piece of information indicating a scheduled use date (which may be a usage scheduled date and time) of the EV 7, the user ID of the usage schedule, the destination of scheduled arrival, the assumed one-way distance (which may be a round trip distance or a travel distance), the content of the scheduled work of the user at the destination, the scheduled use time (h) of the EV 7, and the scheduled stay time (h) of the user at the destination is managed in association with each other.

The one-way distance may be automatically calculated from the destination.

(Each Functional Configuration)

The acquisition unit 31 in the learning phase acquires each piece of usage record data from the usage record data management DB 41 and acquires each piece of usage schedule data (each record in FIG. 6) from the usage schedule data management DB 42. Each piece of usage record data includes data (see the upper three records in FIG. 5) including information regarding charging of the battery (information indicating a charge amount of the battery or information indicating a charging time of the battery) or data (see the lower three records in FIG. 5) not including the information regarding charging. The usage schedule data management DB 42 may be included in the server 5 of FIG. 1. In this case, the acquisition unit 31 acquires each piece of usage schedule data from the server 5 via the communication network.

The charge determination unit 34 determines that the battery has been charged when a predetermined traveling distance based on the information regarding the traveling distance of the vehicle (information indicating a destination, information indicating a travel distance, information indicating a travel time, or the like) included in the usage record data is higher than a threshold.

Alternatively, as another process, the charge determination unit 34 extracts, from each piece of usage record data, specific usage record data including information regarding a travel distance that is the same as or similar to the information regarding a travel distance included in the usage schedule data (information indicating a destination, information indicating a travel distance, or information indicating a travel time), and determines that the battery has been charged in a case where the information regarding charge is included in the specific usage record data.

For example, even when the use time of the EV 7 is the same, whether the charger is installed on the travel route, whether the charging station is located along the way from the departure point to the destination, whether the charging station is located at the destination, or the like also affects the determination result.

In addition, in a case where the EV 7 is a managed vehicle such as a company car, the user has been to the same destination for the same purpose in the past, and it is very effective to refer to the usage record data. On the other hand, in a case where the EV 7 is a personal vehicle, if the usage schedule data and the usage record data are managed by an application of a personal smartphone or the like, the charge determination unit 34 may determine the presence or absence of charging with reference to these data. Note that regardless of a company vehicle or an individual vehicle, the data is also referred to by the correction value calculation unit 35 described below.

In a case where the charge determination unit 34 determines that charging has been performed, the correction value calculation unit 35 calculates a correction value as a predetermined charge amount based on the information indicating the charge amount or the information indicating the charging time included in the usage record data.

Alternatively, in a case where the charge determination unit 34 performs the above-described another process and the charge determination unit 34 determines that charging has been performed, the correction value calculation unit 35 calculates a correction value as a predetermined charge amount based on information indicating a charge amount or information indicating a charging time in the information regarding charging included in the specific usage record data.

For example, in a case where there are a plurality of pieces of usage record data of a travel to the same destination, the correction value calculation unit 35 obtains a correction value using a representative value such as an average value or a mode of a past charge amount. In addition, when there is no charge amount that can be referred to in the usage record data, the correction value calculation unit 35 may use, as the correction value, data calculated from a difference between an estimated reference consumption estimated from the electricity consumption (catalog value) and the one-way distance, and the actual value of the SoC.

The prediction unit 37 predicts the remaining capacity value of the battery at the time of return with respect to the usage schedule data acquired by the acquisition unit 31 using the trained machine learning model 30*b* that outputs the remaining capacity value of the battery at the time of return with the usage schedule data as an input.

The prediction unit 37 utilizes an appropriate prediction method such as regression analysis or SVM. It is assumed that a managed vehicle such as a company car has been going to the same destination with the same requirement in the past, and performance management has been performed. In addition, as long as similar data can be acquired by an application such as a smartphone, the management target is not limited to a company car, and may be a car used in a service such as car sharing.

The correction execution unit 38 uses the correction value calculated by the correction value calculation unit 35 to execute correction on the remaining capacity value of the battery at the time of return predicted by the prediction unit. In addition, after the acquisition unit 31 acquires the plurality of pieces of usage record data, the correction execution unit 38 extracts specific usage record data including information related to a travel distance that is the same as or similar to the information related to the travel distance included in the usage schedule data among the plurality of pieces of usage record data, and executes correction for the remaining capacity value of the battery at the time of return predicted by the prediction unit using the correction value related to the specific usage record data.

For example, the correction value calculation unit 35 may obtain a maximum value or a minimum value of the correction value (charge amount), and the correction execution unit 38 may adjust the correction value assuming a plurality of cases. The correction value can be adjusted for each vehicle. Specifically, in a case where a user who intends to utilize the battery of the EV for the supply and demand control desires information on the discharge capacity (remaining capacity) at the time of supply and demand control on the day of utilization, the correction value calculation unit 35 estimates the remaining capacity to be relatively low based on the corresponding schedule (usage schedule data of the target vehicle), and in a case where the user desires information on the charge capacity (free capacity), the correction value calculation unit 35 estimates the free capacity to be relatively high based on the corresponding schedule.

The output unit 39 outputs the remaining capacity value of the battery that has not been corrected by the prediction unit 37 or the remaining capacity value of the battery that has been corrected by the correction execution unit 38. Examples of the output include a case where the output is displayed on a display connected to the external equipment connection I/F 305 of FIG. 2, a case where the output is transmitted to an external device via the network I/F 306, and the like.

[Processing or Operation of Prediction Apparatus]

Next, processing or operation in the learning phase and the estimation phase of the prediction apparatus 3 will be described with reference to FIGS. 7 to 10.

<Processing or Operation in Learning Phase>

Figure 7:
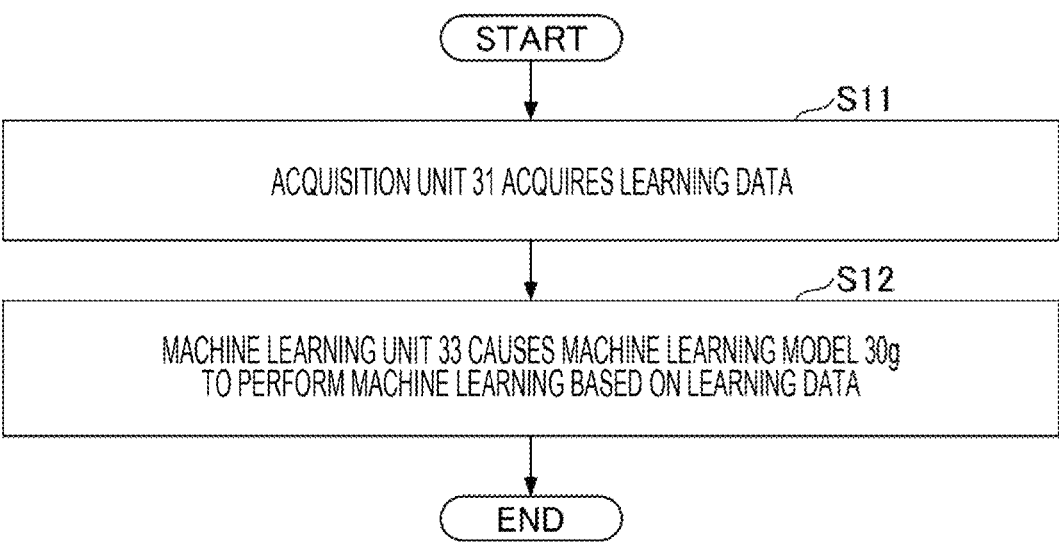
FIG. 7 is a flowchart illustrating processing or operation executed by the prediction apparatus in the learning phase.

FIG. 7 is a flowchart illustrating processing or operation executed by the prediction apparatus in the learning phase.

S11: The acquisition unit 31 acquires each piece of past usage record data (each record in FIG. 5) as learning data from the usage record data management DB 41.

S12: The machine learning unit 33 causes the machine learning model 30*a* to perform machine learning based on the learning data acquired by the acquisition unit 31.

As described above, the description of the processing or operation of the learning phase ends.

<Processing or Operation in Estimation Phase>

Figure 8:
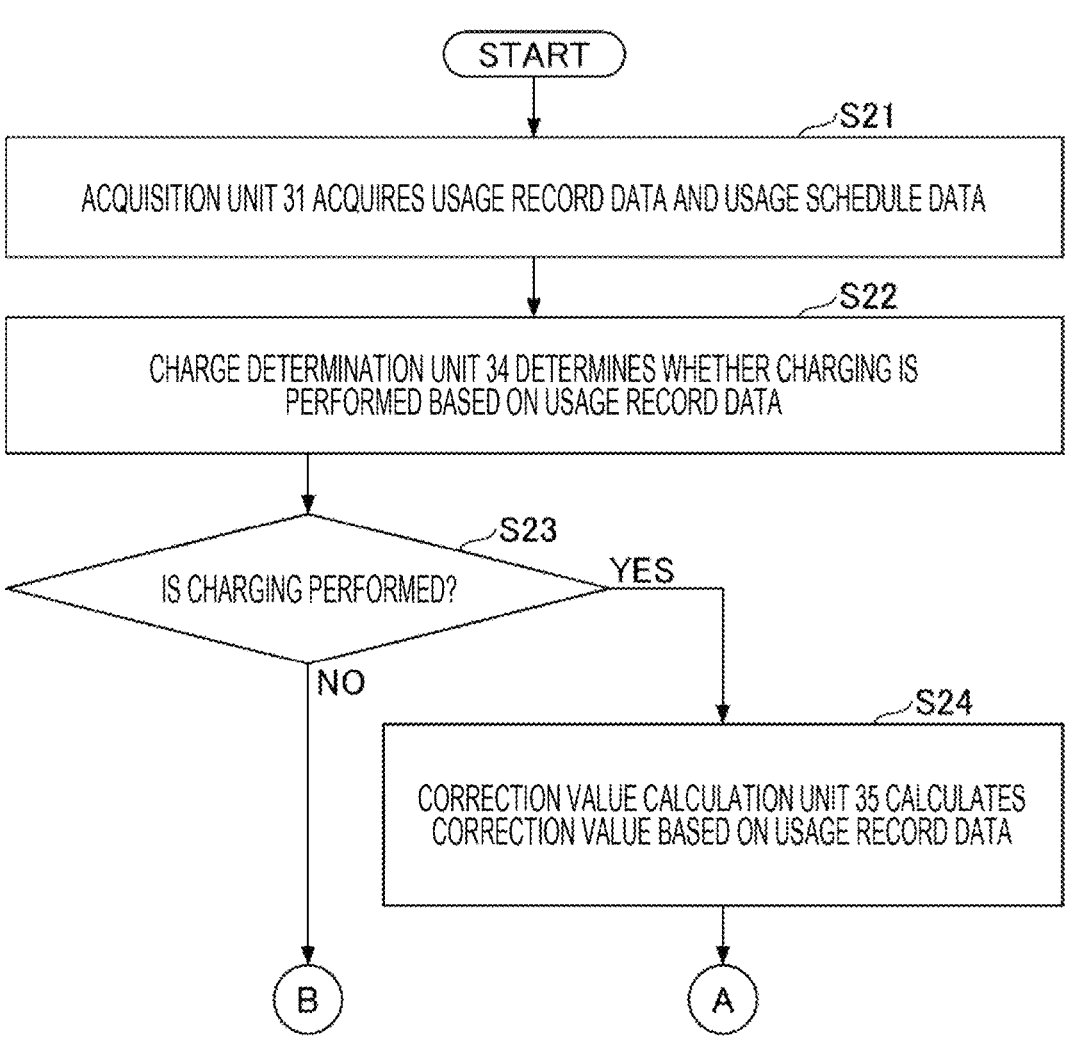
FIG. 8 is a flowchart illustrating processing or operation executed by the prediction apparatus in the estimation phase.
Figure 9:
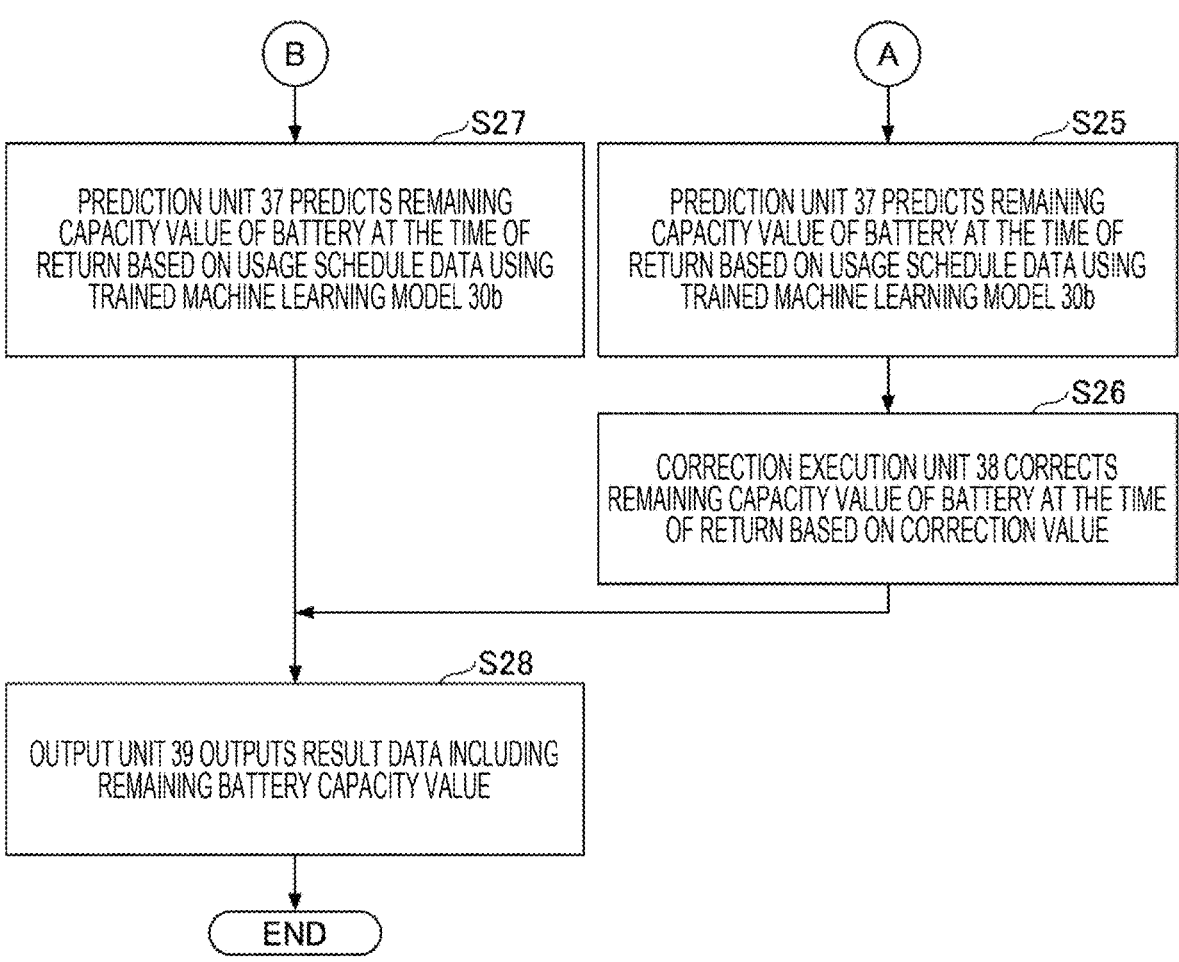
FIG. 9 is a flowchart illustrating processing or operation executed by the prediction apparatus in the estimation phase.

FIGS. 8 and 9 are flowcharts illustrating processing or operation executed by the prediction apparatus in the estimation phase. Note that the processing in FIGS. 8 and 9 is an example executed by each functional unit illustrated in FIG. 4, and is not limited to the following processing.

S21: The acquisition unit 31 acquires each piece of usage record data from the usage record data management DB 41, and acquires each piece of usage schedule data from the usage schedule data management DB 42.

S22: For each piece of usage record data, the charge determination unit 34 determines that charging has been performed when information (information indicating a destination, information indicating a travel distance (one-way distance, round-trip distance, or the like), or information indicating a travel time) on a travel distance included in the usage record data is higher than a threshold predetermined by machine learning or the like. Alternatively, the charge determination unit 34 determines that charging has been performed based on information regarding charging (information indicating presence of charging, information indicating charging time, and information indicating charge amount or charging place) included in the usage record data. For example, the charge determination unit 34 determines that there is a record of charging for three pieces of predetermined usage record data (use date: 2022 Feb. 20, 2022 Feb. 23, 2022 Mar. 23) related to records from the uppermost to third record among the usage record data in FIG. 5.

S24: In a case where it is determined in step S22 that charging has been performed (S23; YES), the correction value calculation unit 35 calculates the correction value as the charge amount based on the information (information indicating charge amount or information indicating charging time) regarding the charge amount included in the predetermined usage record data for each piece of predetermined usage record data determined to be charged by the charge determination unit 34. For example, in a case where the charge amount is used as the information regarding the charge amount, the correction value calculation unit 35 calculates the correction value by multiplying the charge amount by 1.0 or the like. Furthermore, in a case where the charging time is used as the information regarding the charge amount, the correction value calculation unit 35 calculates the correction value based on the charging time and the known information of the "charge amount per charging time".

S25: The prediction unit 37 predicts the remaining capacity value of the battery at the time of return for each piece of usage schedule data acquired by the acquisition unit 31 using the trained machine learning model 30*b*.

S26: The correction execution unit 38 extracts specific usage record data including information regarding a travel distance, which is the same as or similar to the information regarding the travel distance included in the usage schedule data, from among the predetermined usage record data for each piece of usage schedule data related to the correction target, and adds the correction value related to the specific usage record data to the remaining capacity value of the battery at the time of return predicted by the prediction unit 37, thereby generating a corrected remaining battery capacity value. For example, the correction execution unit 38 extracts specific usage record data (use date: 2022 Feb. 20) having the same destination B and travel distance (one-way distance 60 km) among three predetermined usage record data (use date: 2022 Feb. 20, 2022 Feb. 23, 2022 Mar. 23) with respect to the usage schedule data (scheduled use date: 2022 May 1) related to the correction target, and adds the correction value (70 kWh) calculated by the correction value calculation unit 35 in step S24 with respect to the specific usage record data to the remaining capacity value of the battery at the time of return predicted by the prediction unit 37, thereby generating a corrected remaining battery capacity value. Similarly, the correction execution unit 38 also generates a remaining capacity value of the battery at the time of return after correction for other usage schedule data (scheduled use date: 2022 May 2, 2022 May 3) related to the correction target. In addition, the "similar information" indicates a case where the destination related to the usage record and the destination related to the usage schedule are within a predetermined value (for example, 3 km), or a case where the one-way distance related to the usage record and the one-way distance related to the usage schedule are within a predetermined value (for example, 3 km).

S27: On the other hand, when it is not determined in step S22 that the battery is charged (S23; NO), the prediction unit 37 predicts the remaining capacity value of the battery at the time of return for each piece of usage schedule data acquired by the acquisition unit 31 using the same processing as step S27, that is, the trained machine learning model 30*b*.

S28: The output unit 39 outputs result data including the remaining battery capacity value at the time of return predicted in step S27 or the remaining battery capacity value at the time of return after correction corrected in step S26.

Figure 10:
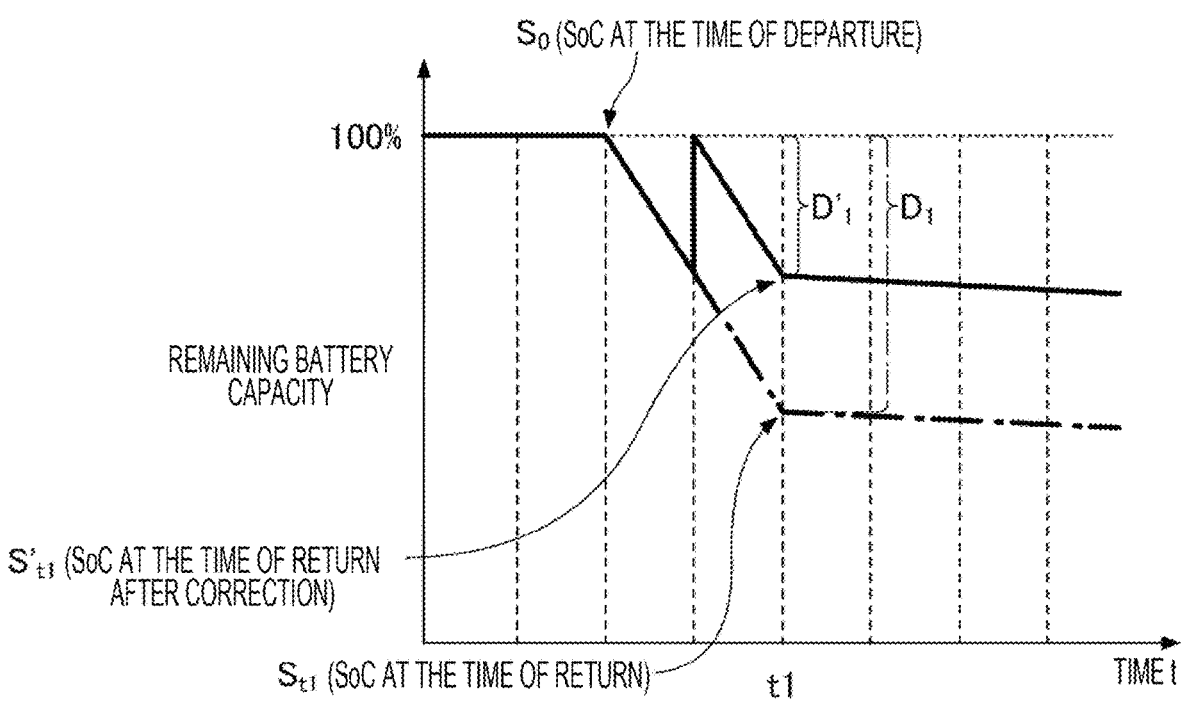
FIG. 10 is a diagram for explaining prediction of remaining battery capacity.

FIG. 10 is a diagram for explaining prediction of remaining battery capacity. For example, as illustrated in FIG. 10, assuming that the remaining battery capacity at the time of departure is $S_0$ and the predicted value of the power consumption in the case of no correction is $D_1$, the output unit 39 can calculate the remaining battery capacity as "$S_0$-$D_1$" (see the one-dot chain line). On the other hand, when the corrected predicted value of the power consumption is $D'_1$, the output unit 39 can calculate the remaining battery capacity as "$S_0$-$D'_1$" (see the solid line). When SoC (%) is obtained as the remaining battery capacity, the remaining capacity in kwh can be obtained by output unit battery capacity×SoC.

As described above, on a certain future day, the output unit 39 can predict, for example, the charge and discharge capacity available at night of the day by summing the calculated predicted value of EV per vehicle in all vehicles.

Thus, the description of the processing or operation of the estimation phase ends.

Effects of Embodiment

As described above, according to the present embodiment, it is possible to predict the remaining battery capacity using data (individual scheduler, vehicle operation management data, and the like) adopted by relatively many people (companies) and data derived from a catalog value (electricity consumption) and the like, such as usage schedule data and usage record data, and thus, it is possible to more easily predict the remaining battery capacity of a vehicle such as an EV than in the prior art.

In addition, by using the correction value, it is possible to predict a more realistic remaining capacity of the battery corresponding to a case where the battery is charged by a situation or a person (for example, there is a charging place at a destination) without causing an electricity shortage. Therefore, a user who utilizes the battery of the EV for supply and demand control can easily make a utilization schedule.

[Supplementary Notes]

The present invention is not limited to the above embodiment and may be configured or processed (operated) as described below.

(1) The prediction apparatus 3 can also be implemented by a computer and a program, but the program may be recorded on a (non-transitory) recording medium or provided via the communication network.

(2) In the above embodiment, a laptop personal computer is shown as an example of the prediction apparatus 3, but the prediction apparatus 3 is not limited to this, and may be, for example, a desktop personal computer, a tablet terminal, a smartphone, a smartwatch, a car navigation device, a refrigerator, a microwave oven, or the like.

(3) Each CPU 301 may be not only a single CPU or may be a plurality of CPUs.

(4) An EV (electric vehicle) is an example of a vehicle equipped with a battery. The vehicle also includes an electric bicycle, an electric scooter, an electric motorcycle, and the like.

REFERENCE SIGNS LIST

1 Communication system
3 Prediction apparatus
5 Server
30*a* Machine learning model
30*b* Trained machine learning model
31 Acquisition unit (input unit)
33 Machine learning unit
34 Charge determination unit
35 Correction value calculation unit
37 Prediction unit
38 Correction execution unit
39 Output unit
41 Usage record data management DB (an example of a usage record data management unit)
42 Usage schedule data management DB (an example of a usage schedule data management unit)

The invention claimed is:

1. A prediction apparatus for predicting a remaining capacity value of a battery of a vehicle, the prediction apparatus comprising:
   a processor; and
   a memory storing instructions that cause the processor to execute a process, the process including
   acquiring usage record data including information regarding a travel distance of the vehicle and information indicating a charge amount of the battery or information indicating a charging time of the battery as a past use record of the vehicle, and acquiring usage schedule data including information regarding a travel distance of the vehicle as a future usage schedule of the vehicle;
   determining that the battery has been charged when a predetermined travel distance based on the information regarding the travel distance included in the usage record data is higher than a threshold;

calculating a correction value as a predetermined charge amount based on information indicating the charge amount or information indicating the charging time included in the usage record data in response to determining that charging has been performed;

predicting a remaining capacity value of the battery at the time of return with respect to the acquired usage schedule data using a trained machine learning model that outputs a remaining capacity value of the battery of the vehicle at the time of return with the usage schedule data as an input;

using the calculated correction value to execute correction on the predicted remaining capacity value of the battery at the time of return; and outputting a remaining capacity value of the battery after executing the correction.

2. The prediction apparatus according to claim 1, wherein acquiring includes acquiring a plurality of pieces of the usage record data, and the extracting includes extracting specific usage record data including information on a travel distance that is the same as or similar to the information on the travel distance included in the usage schedule data among the plurality of pieces of the usage record data, and executes correction for the predicted remaining capacity value of the battery at the time of return using the correction value related to the specific usage record data.

3. A prediction apparatus for predicting a remaining capacity value of a battery of a vehicle, the prediction apparatus comprising:

a processor; and a memory storing instructions that cause the processor to execute a process, the process including acquiring a plurality of pieces of usage record data including information regarding a travel distance of the vehicle and information regarding charging including information indicating a charge amount of the battery or information indicating a charge time of the battery as use records of the vehicle in the past or not including the information regarding charging as use records of the vehicle in the past, and acquiring usage schedule data including information regarding a travel distance of the vehicle as a usage schedule of the vehicle in the future;

extracting, from among the plurality of pieces of usage record data, specific usage record data including information regarding a travel distance that is the same as or similar to the information regarding the travel distance included in the usage schedule data, and determining that the battery has been charged in a case where the specific usage record data includes the information regarding charging;

calculating a correction value as a predetermined charge amount based on information indicating the charge amount or information indicating the charging time among the information regarding charging included in the specific usage record data in response to determining that charging has been performed;

predicting a remaining capacity value of the battery at the time of return with respect to the acquired usage schedule data using a trained machine learning model that outputs a remaining capacity value of the battery at the time of return of the vehicle with the usage schedule data as an input;

using the calculated correction value to execute correction on the predicted remaining capacity value of the battery at the time of return; and outputting a remaining capacity value of the battery after executing the correction.

4. The prediction apparatus according to claim 1, wherein the information regarding the travel distance of the vehicle is information indicating a destination, information indicating a travel distance, or information indicating a travel time.

5. A prediction method executed by a prediction apparatus for predicting a remaining capacity value of a battery of a vehicle, the prediction method comprising:

acquiring usage record data including information regarding a travel distance of the vehicle and information indicating a charge amount of the battery or information indicating a charging time of the battery as a past use record of the vehicle, and acquiring usage schedule data including information regarding a travel distance of the vehicle as a future usage schedule of the vehicle;

determining that the battery is charged in a case where a predetermined traveling distance based on the information regarding the traveling distance included in the usage record data is higher than a threshold;

calculating a correction value as a predetermined charge amount based on information indicating the charge amount or information indicating the charging time included in the usage record data in response to determining that charging has been performed in the determining;

predicting a remaining capacity value of the battery at the time of return with respect to the usage schedule data acquired by the acquiring using a trained machine learning model that outputs a remaining capacity value of the battery at the time of return of the vehicle with the usage schedule data as an input;

executing correction on the remaining capacity value of the battery at the time of return predicted by the predicting using the correction value calculated by the calculating; and outputting a remaining capacity value of the battery after correction by the executing.

6. A non-transitory computer-readable recording medium having computer-readable instructions stored thereon, which when executed, cause a computer to execute the method according to claim 5.

* * * * *